United States Patent [19]

Möring et al.

[11] Patent Number: 4,672,447
[45] Date of Patent: Jun. 9, 1987

[54] CIRCUIT ARRANGEMENT FOR SYNCHRONIZATION OF A SIGNAL

[75] Inventors: Wilhelm Möring; Walter H. Demmer; Detlef W. K. Oldach, all of Hamburg, Fed. Rep. of Germany

[73] Assignee: U.S. Philips Corporation, New York, N.Y.

[21] Appl. No.: 770,543

[22] Filed: Aug. 29, 1985

[30] Foreign Application Priority Data

Sep. 3, 1984 [DE] Fed. Rep. of Germany ....... 3432313

[51] Int. Cl.$^4$ .......................... H04N 5/04; H03L 7/00
[52] U.S. Cl. ................................... 358/148; 358/158; 331/1 R; 331/1 A; 331/11; 331/20; 331/25; 375/111; 375/120; 329/122
[58] Field of Search ................ 358/148, 158, 159, 17, 358/149; 375/111, 119, 120; 331/1 R, 1 A, 11, 20, 25; 329/50, 122; 328/63, 72–74, 133, 139, 150, 179, 155

[56] References Cited

U.S. PATENT DOCUMENTS 4,214,260  7/1980  van Straaten ..................... 358/148
4,461,999  7/1984  Wolf et al. ........................ 358/159
4,574,307  3/1986  Nillesen ............................ 358/159

Primary Examiner—James J. Groody
Assistant Examiner—Michael D. Parker
Attorney, Agent, or Firm—Thomas A. Briody; Jack Oisher; William J. Streeter

[57] ABSTRACT

In a circuit arrangement for synchronization of the phase of a frequency-divided signal with an edge of finite slope of an essentially periodic synchronizing signal with an oscillator supplying a clock signal, a frequency divider which generates the frequency-divided signal and a phase detector which comprises a first comparator for coarse phase detection, a second comparator for fine phase detection and a selector circuit which derives a resulting phase signal applied to the oscillator to control the frequency of the clock signal and originating from the first comparator in the case of large phase variations and from the second comparator in the case of small phase variations, precise adjustment to the edge is nevertheless achieved in the case of an amplitude-discrete synchronizing signal with limited time resolution because of the fact that the synchronizing signal is applied to the phase detector as a sequence of amplitude-discrete values which is formed by sampling the synchronizing signal with the clock signal, a sufficient number of amplitude stages being provided for the edge in the synchronizing signal.

10 Claims, 6 Drawing Figures

CIRCUIT ARRANGEMENT FOR SYNCHRONIZATION OF A SIGNAL

FIELD OF THE INVENTION

The invention relates to a circuit arrangement for synchronizing the phase of a frequency-divided signal with an edge of finite slope of an essentially periodic synchronizing signal, including a clock signal oscillator whose frequency is controllable, a frequency divider for generating the frequency-divided signal by dividing the frequency of the clock signal by an integer, and a phase detector comprising: a first comparator arrangement for determining the phase difference between a reference instant in the frequency-divided signal and the edge of the synchronizing signal and for supplying a first phase signal which is a measure of this phase difference, a second comparator arrangement for sampling the value of the synchronizing signal at the reference instant and for supplying a second phase signal formed from this value, and as a selector circuit for deriving a resulting phase signal to be applied to the oscillator for controlling the frequency of the clock signal from the first phase signal when this exceeds a limit value and for deriving the resulting phase signal from the second phase signal in the opposite case.

BACKGROUND OF THE INVENTION

Such a circuit arrangement is known from German Patent Application No. 2,802,626 as a phase-locked loop, for example, for locking the frequency of an oscillator to a reference frequency or a multiple or part of the said frequency. The known circuit arrangement has a phase comparator arrangement for comparing the phases of first and second input signals which are supplied as substantially square-wave or trapezoidal analog signals. The phase difference between these two signals is measured in a first and a second comparator, the second comparator having a phase difference range of less than 180° and the first comparator having a much larger phase difference range than the second. If the phase difference between the input signals is greater than the range of the second comparator, the known phase comparator arrangement derives an output signal corresponding to the phase difference from the first comparator, whereas the output signal is derived from the second comparator arrangement when the phase difference falls within the range of the second comparator arrangement. In this way, coarse phase comparison is achieved with the first comparator arrangement and fine phase comparison with the second comparator arrangement. This ensures locking of the phase-locked loop from any phase differences of the input signals.

In principle, such a circuit arrangement can also be used to advantage when, instead of analog input signals, the phases of digital signals are to be compared. Digital signals are taken here to mean signals which consist of a time-discrete sequence of amplitude-discrete values. Such signals are restricted in their time resolution by the repetition rate of the amplitude-discrete values. This repetition rate also determines the resolution for the phase comparison, i.e. the lowest detectable phase difference between the input signals. If precise determination of this phase difference is required, the input signals must exhibit a high time resolution by using a high repetition rate for the amplitude-discrete values. However, such high repetition rates require high signal processing rates, i.e. high clock rates for which control signals with very high frequencies are needed. Such high-frequency signals, however, cannot be processed with the known circuit arrangements.

SUMMARY OF THE INVENTION

The aim of the invention is to provide a circuit arrangement of the type mentioned in the preamble such that with limited time resolution of the input signals of the phase detector and therefore low repetition rate of the amplitude-discrete values representing these signals, a precise detection of the phase difference and therefore precise synchronization with the edge of the synchronizing signal can still be achieved. To achieve this aim the circuit of the invention is characterized in that the synchronizing signal is applied to the phase detector as a sequence of amplitude-discrete values formed by sampling the synchronizing signal with the clock signal, a sufficient number of amplitude stages being provided for the edge in the synchronizing signal.

In the circuit arrangement of the invention the synchronizing signal is sampled by the clock signal supplied from the oscillator. The clock signal in this case gives a time slot pattern of sampling points. When there is a change in the phase position, i.e. the phase difference between the synchronizing signal, on the one hand, and the frequency-divided signal derived from the clock signal, on the other, this time slot pattern is continuously displaced with respect to the synchronizing signal. This also brings about a variation in the amplitude-discrete values obtained during sampling of the synchronizing signal, the resolution for a detection of this variation being determined by the resolution and therefore by the number of the amplitude stages for the synchronizing signal.

If now a sufficient number of amplitude stages is provided for the edge in the synchronizing signal, then even a small shift of the phase position between the analog synchronizing signal and the time slot pattern given by the clock signal will bring about a noticeable variation in the amplitude-discrete values obtained by sampling the edge. The resolution for the detection of this variation of the phase position can eventually be improved by increasing the number of amplitude stages without having to increase the frequency of the clock signal and therefore the repetition rate of the sampling time slot pattern. This enables a resolution of any fineness at a specified clock frequency.

The construction of the phase detector used in the circuit arrangement of the invention with both coarse and fine detection also makes it possible in the event of an essentially pulsed synchronizing signal to supply an unambiguous phase signal for controlling the oscillator for any phase positions between the synchronizing signal and the frequency-divided signal such that synchronization of the clock signal with the synchronizing signal is achieved for any phase variations and also for frequency variations between the synchronizing signal and the frequency-divided signal. The sampling of a pulsed synchronizing signal in the second comparator arrangement supplies in fact such an unambiguous value only in the range of, or possibly a small time interval before or after, the edge with which the clock signal is to be synchronized. Usually, in fact, such a synchronizing signal assumes a given value at several instants within a period duration. For an unambiguous, i.e. phase-rigid synchronization, however, it has to be ensured, for example, that the value on the leading edge of the pulse is always selected. The measuring range of the second comparator arrangement for the fine phase detection therefore covers mainly the edge in the synchronizing signal, whereas the measuring range of the first comparator arrangement for the coarse phase detection covers at least one period of the synchronizing signal or of the frequency-divided signal.

The selector circuit performs a switching operation between the coarse phase detection in the first comparator arrangement and the fine phase detection in the second comparator arrangement. For this purpose the value of the first sampling signal is compared with the limit value. The latter is selected in such a way that the second sampling signal assumes an unambiguous value and thus supplies an unambiguous phase signal for controlling the oscillator when the first sampling signal falls below the limit value.

At this point it should be mentioned, for the sake of completeness, that German Patent Application No. 3,239,933 (PHD 82.120) describes a circuit arrangement in which an a.c. signal, in particular the colour synchronizing signal in a colour TV receiver, as the synchronizing signal and a reference signal, preferably of approximately the same frequency, are fed to a phase detector. From the comparison of signals fed to it the phase detector forms a control signal which is fed via a PI controller and an analog-digital converter to a controllable oscillator for controlling the frequency of a clock signal delivered by it. The clock signal is frequency-divided down to the frequency of the reference signal in a pulse-shaping stage connected after the controllable oscillator. From the frequency-divided signal thus obtained is obtained the reference signal fed to the phase detector. In this circuit arrangement the clock signal from the controllable oscillator is coupled in frequency and phase to the a.c. signal supplied to the phase detector.

In the phase detector of the circuit arrangement described in said patent application the a.c. signal supplied as the synchronizing signal is sampled at determined instants which are determined by a symmetrical square-wave oscillation the frequency of which corresponds to four times the frequency of the reference signal supplied as the comparison signal. From these sampling values the phase detector forms the control signal fed to the oscillator. Because in the case of the a.c. signal this is a signal with a definite variation with time i.e. a sinusoidal signal, an unambiguous control signal is always obtained by combinations of the sampling values of the a.c. signal.

If, on the other hand, an essentially pulsed synchronizing signal is present, for example a line synchronizing signal contained in a television signal, on which, in certain cases, remnants of a picture signal are superimposed, the said circuit arrangement does not supply an unambiguous control signal.

According to a further development of the invention the resulting phase signal after the first phase signal exceeds the limit value is derived from the latter only when it exceeds the limit value within a determined time interval each time after the occurence of the last edge in the synchronizing signal.

When strong interferences occur in the synchronizing signal it can happen that these are wrongly identified by the first comparator arrangement as edges and that, consequently, when such interferences occurs, an incorrect first phase signal is formed which exceeds the limit value and thus simulates an incorrect synchronization to the selector circuit. This can bring the circuit arrangement out of the synchronized state. Therefore, to reduce the susceptibility to interference in the synchronized state of the circuit arrangement, i.e. the state in which the fine phase detection is active, a first phase signal which exceeds the limit value will influence the selector circuit and thus set the coarse phase detection in operation only if the sections in the synchronizing signal which are identified as edges occur essentially with the period of the synchronizing signal. In other words: a time interval, in the form of a time window, is fixed, each time from the last edge in the synchronizing signal, and the next edge of the synchronizing signal must occur within this interval. The next edge in the synchronizing signal occurring in this interval is then identified as such whereas all signal parts lying outside this time interval cannot be identified as edges. In this way all interferences outside the time interval are suppressed. Furthermore, the size of the time interval can be variable.

If the circuit arrangement is in the state in which the coarse phase detection is active, it is preferable that each edge in the synchronizing signal is evaluated, i.e. the above-mentioned interference suppression is disabled, in order to accelerate the synchronization until the fine phase regulation in operation again.

In a further embodiment of the invention the first comparator arrangement comprises a signal generator for supplying an essentially ramp-shaped comparison signal and an edge detector and a first sample-and-hold circuit for storing the instantaneous value of the ramp-shaped comparison signal and for delivering this value as the first sampling signal when the edge detector detects the edge in the synchronizing signal. Because in the case of a ramp-shaped signal there is an unambiguous, direct relationship between the signal value and the phase, a first comparator arrangement constructed in this way can in simple manner generate a first phase signal and therefore a phase signal which represents a direct measure of the phase position between the comparison signal and the edge. The ramp-shaped signal preferably has an amplitude-discrete, stepped variation, the time interval between the steps being determined by the period of the clock signal.

In a further embodiment of the invention, the reference instant is determined by a passage of the comparison signal through a reference value and the second comparator arrangement comprises a reference value detector and a second sample-and-hold circuit for storing the instantaneous value of the synchronizing signal and for delivering this value as a second phase signal when the reference value detector detects a passage of the comparison signal through the reference value. The reference value fixes an unambiguous instant or phase position within the period of the comparison signal and therefore a definite phase position in the clock signal issued by the oscillator which is to coincide with the edge in the synchronizing signal. However, this phase position or this instant can also be derived directly from the frequency-divided signal, in which case the fixed allocation to the reference value is retained. The second sample-and-hold circuit is then directly driven by the frequency-divided signal, and the reference value detector can then be omitted. In such an embodiment of the circuit arrangement, however, signal transit times in the signal generator and in the reference value detector have eventually to be taken into consideration.

According to a further development of the invention a zero-setting arrangement is connected to the second comparator arrangement having a synchronizing input for receiving the synchronizing signal, said synchronizing signal being applied to the second comparator arrangement through said zero-setting arrangement. In this way the zero value of the synchronizing signal can be set and thus, for example, a constant value can be superimposed on the second phase signal. The zero-setting arrangement may also contain a device which samples the pulse amplitudes of the synchronizing signal and re-fixes the zero of the synchronising signal as a function of these. In particular, the zero can be set at a definite point of the edge of the synchronising signal, in the centre for example. The edge detector may then be designed advantageously as a zero passage detector which detects a change of sign in a given direction of the synchronizing signal. The clock signal is then synchronized to the instant of the passage of the synchronizing signal through zero.

According to a further embodiment of the invention, between the selector circuit and the first comparator arrangement a steepness-matching circuit is connected for adapting the slopes of the ramp-shaped comparison signal and the edge in the synchronzing signal to each other, the first phase signal being applied through said steepness-matching circuit to the selector circuit. This matches the steepness of the first phase signal, i.e. its variation over the phase, with the steepness of the second phase signal. Thus, particularly when there is a very steep edge in the synchronizing signal, the steepness of the second phase signal, i.e. its variation over the phase, becomes very large, whereas the first phase signal has small steepness, particularly when it has available only a limited range of values and is to exhibit a constant steepness over a whole period of the synchronizing signal. The steepness-matching circuit can be implemented in such a way that the first phase signal is multiplied by a fixed multiplying factor, but this multiplying factor may also be variable and may, for example, be controlled in its value by the amplitude of the synchronizing signal.

According to another embodiment of the invention, the frequency divider and the signal generator are formed by a common counter continuously switched by the clock signal. The frequency-divided signal delivered by the frequency divider and the ramp-shaped comparison signal issued from the signal generator are then always interlinked, since both can be directly derived from the positions of the counter. The frequency divider and the signal generator include stages especially connected after the counter in which certain counter positions are detected. Also, a separate signal generator can be dispensed with, and the positions of the counter can be directly used as a digital ramp-shaped signal. In such an embodiment of the circuit arrangement of the invention the resulting phase signal is also present in the form of a digital signal.

According to a further embodiment of the circuit arrangement of the invention for use in an arrangement for obtaining a sequence of amplitude-discrete television signal values from an analog television signal the synchronizing signal is a line synchronizing signal contained in the television signal, the clock signal being used for obtaining the amplitude-discrete television signal values and the frequency divider deriving horizontal synchronizing pulses from the frequency-divided signal. In such an arrangement it is advantageous if the clock signal which determines the repetition rate of the sequence of amplitude-discrete values obtained from the analog television signal by sampling what is fixed with regard to its frequency at an integral multiple of the line synchronizing signal. It is expedient, therefore, and can be advantageously achieved with the circuit arrangement of the invention, to synchronize the clock signal with the line synchronizing signal. In this case the line synchronizing signal is supplied as an analog signal which by sampling with the clock signal and quantization is converted into a digital signal which consists of a clock-frequency sequence of amplitude-discrete values. The frequency divider preferably lowers the frequency of the clock signal by division down to the frequency of the line synchronizing signal so that the frequency-divided signal is synchronized with the line synchronizing signal from the television signal. From the frequency-divided signal it is a simple matter to derive, as a shaped line synchronizing signal for the further signal processing, in a picture reproduction device for example, horizontal synchronizing pulses which are directly coupled with the clock signal and therefore with the sequence of amplitude-discrete television signal values forming a digital television signal, the said values being formed from the analog television signal by sampling.

According to a further embodiment of the invention the resulting phase signal is applied to the oscillator via a digital-analog converter. By this means the digital phase signal is converted into an analog signal, an analog control voltage for example, for controlling the oscillator which can then be constructed in the form, known in the art, of a voltage-controlled oscillator. The phase signal is preferably fed to the oscillator via a loop filter which is designed for example as a PI-controller. This can influence the control behaviour of the circuit arrangement. The loop filter can be inserted in the path of the phase signal as an analog filter after the digital-analog converter or especially as a digital filter before it.

According to a further development of the invention the resulting phase signal is applied to the oscillator via an interpolation filter.

In the circuit arrangement according to the invention, only one value is formed for the resulting phase signal in each period of the synchronizing signal because in each period of the synchronizing signal the comparators generate only one value each for the first and second phase signals. This one value of the resulting phase signal then determines the frequency of the clock signal for the duration of the relevant period of the synchronizing signal. This can lead, especially in the unsynchronized state of the circuit arrangement, to the occurrence of large jumps between successive values of the resulting phase signal, which results in large jumps in the frequency and/or phase of the clock signal. If, for example, the clock signal is used for the processing of a digital television signal, such jumps in frequency and/or phase can have an adverse effect on picture quantity.

The interpolation filter which is inserted in the signal path of the resulting phase signal from the phase detector to the oscillator converts jumps in the resulting phase signal into fixed phase signal variations, in ramp form for example. Such an interpolation filter is constructed for example as an analog circuit with lowpass-type signal transmission behaviour or, preferably, as a digital circuit which for a sequence of instants within a period between two sampled edges of the synchronising signal calculates, on the basis of the position of the instants, weighted means between two successive values of the resulting phase signal delivered by the phase detector. By this means the initially stepped curve form of the resulting phase signal at the output of the phase detector is supplemented by additional values which depending on their number per period of the synchronizing signal approximate to a fixed and, in particular, a linear variation for the resulting phase signal. Such an interpolation filter is simple to control by the clock signal, thus ensuring uniform subdivision of the period of the synchronizing signal. The repetition rate of the interpolated values for the resulting phase signal, as supplied by the interpolation filter, can thus be fixed in wide ranges right up to the frequency of the clock signal. A reversible interpolation filter with different, selectable repetition rates may be also be constructed.

BRIEF DESCRIPTION OF THE DRAWINGS

Embodiments of the invention are described in detail below and explained with the aid of the drawings which show.

DETAILED DESCRIPTION OF PREFERRED EMBODIMENTS

Figure 1:
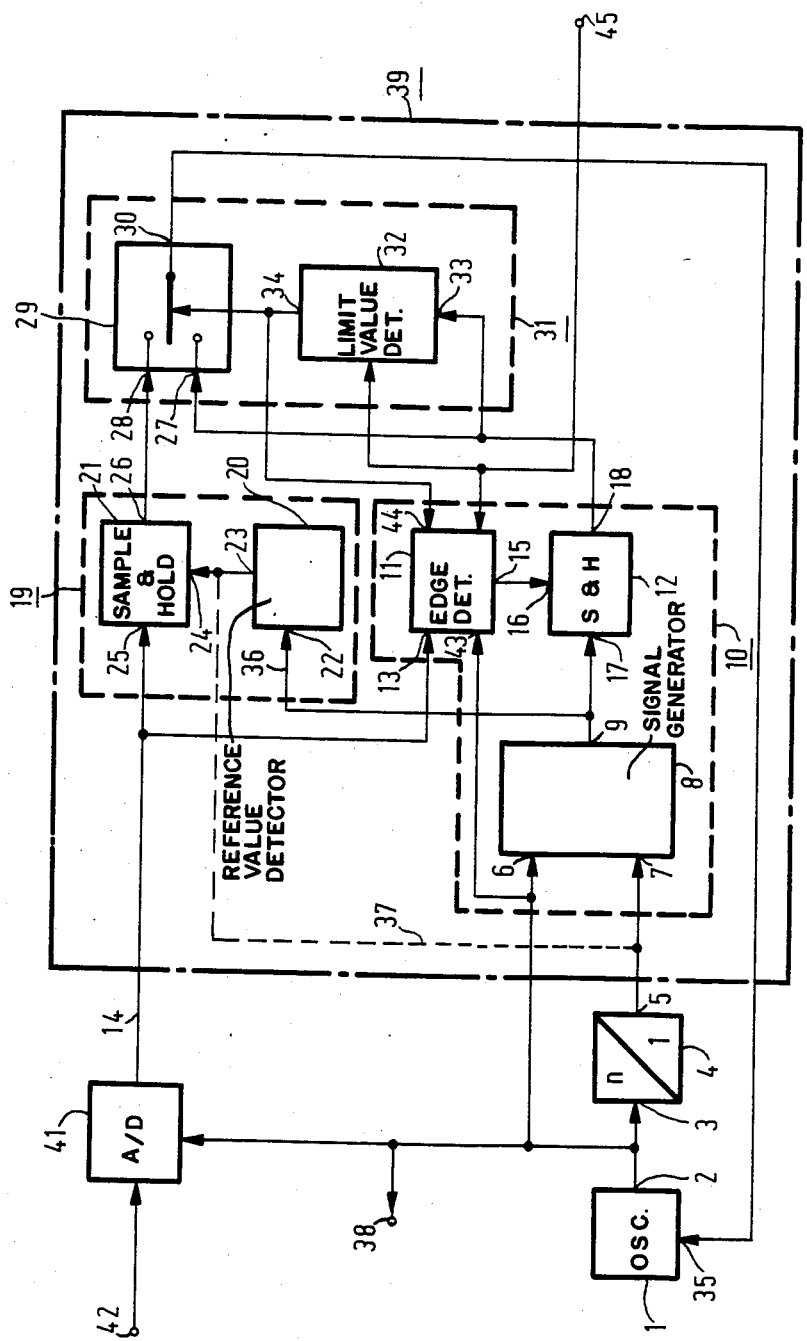
FIG. 1 a block circuit diagram for an example of an embodiment.

FIG. 1 shows a block circuit diagram of a first, simple embodiment of the circuit arrangement of the invention. At an output 2 an oscillator 1 delivers a clock signal with, for example, sinusoidal or preferably squarewave shape. The clock signal is fed to an input 3 of a frequency divider 4 which divides its frequency by a whole number and at its output 5 issues a frequency-divided signal which, preferably, has a squarewave form.

The clock signal from the output 2 of the oscillator 1 and the frequency-divided signal from the output 5 of the frequency divider 4 are fed to first and second inputs 6, 7 of a signal generator 8 which derives from them an unambiguous comparison signal in each period of a synchronizing signal and issues it at an output 9. The comparison signal preferably has a ramp-shaped variation with a uniform slope over the entire period of the synchronizing signal, but a signal may also be issued with slope varying within the period. Signal generators for the production of such comparison signals are known in principle. In the present circuit arrangement a signal generator is preferred which delivers a sequence of amplitude discrete values approximating to a ramp-shaped signal with a repetition rate determined by the clock signal, the start of the ramp being determined by the frequency-divided signal. If required, a signal generator can also be implemented such that only the clock signal has to be fed to it at the first input 6.

Figure 2:
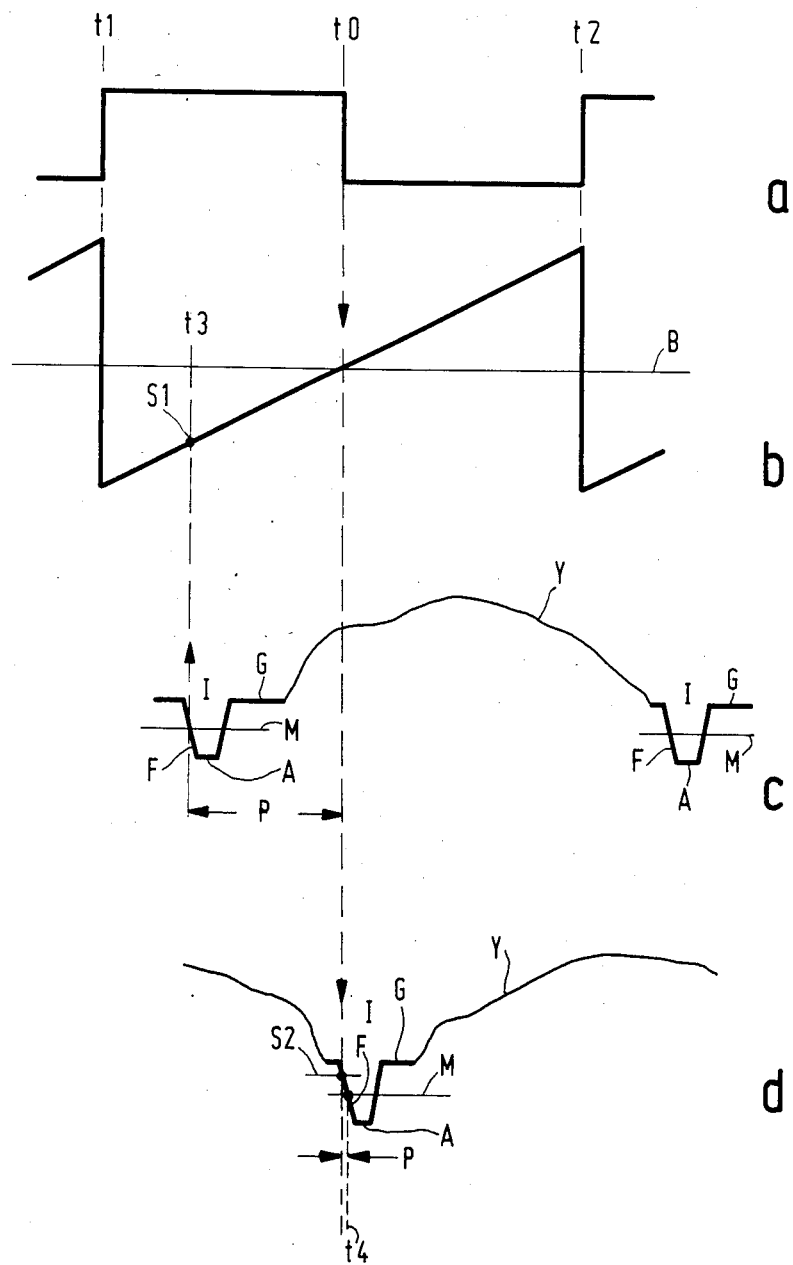
FIG. 2 some signal variation curves from the circuit arrangement as illustrated in FIG. 1, FIG. 3 a block circuit diagram of a further example of an embodiment, FIG. 4 a modification of the circuit arrangement in FIG. 3, FIG. 5 a somewhat more detailed block circuit diagram of a part of the circuit arrangement in FIG. 4.

The signal generator 8 is part of a first comparator arrangement 10 which is encircled in FIG. 2 by a dashed line and which, in addition to the signal generator 8, also contains an edge detector 11 and a first sample-and-hold circuit 12. The synchronizing signal from the synchronizing signal terminal 14 is fed to the edge detector 11 at an input 13. On the occurence of an edge in the synchronizing signal with which the clock signal is to be synchronized the edge detector 11 delivers at an output 15 a first switching signal which is fed to the switching signal input 16 of the first sample-and-hold circuit 12. On the occurrence of the first switching signal the first sample-and-hold circuit 12 samples the value of the comparison signal fed to it via a comparison signal input 17 and makes this available at an output 18 for the duration of a period of the synchronizing signal as a first phase signal, i.e. until the occurrence of the next edge in the synchronizing signal which in the edge detector 11 initiates the formation of a first switching signal.

The circuit arrangement illustrated in FIG. 1 also contains a second comparator arrangement 19 which is indicated by a dashed line and which includes a reference value detector 20 and a second sample-and-hold circuit 21. The comparison signal is fed from the output 9 of the signal generator 8 to the reference value detector 20 at an input 22 and detector 20 issues a second switching signal at an output 23 when the comparison signal passes through a given reference value B at a reference instant t0. This reference value B can be fixed at any value between the maximum possible and the minimum possible values of the comparison signal. For example, in the case of a ramp-shaped comparison signal the reference value is placed in the middle of the ramp. At the moment the comparison signal passes through the reference value, the second switching signal is fed from the output 23 to a switching signal input 24 of the second sample-and-hold circuit 21. Sample-and-hold circuit 21 then samples the value of the synchronizing signal, which is fed from the synchronizing signal terminal 14 to a synchronizing signal input 25 of the second sample-and-hold circuit 21, which makes it available at an output 26 as a second phase signal until the reference value detector 20 issues once again a second switching signal.

The value of the comparison signal issued from the output 18 of the first sample-and-hold circuit 12 as the first phase signal and the second phase signal from the output 26 of the second sample-and-hold circuit 21 are fed to a first and second input 27, 28 respectively of a change-over switch 29 which has an output 30 which can be connected either to the first input 27 or the second input 28. The switch 29 is part of a selector circuit 31 which is indicated in FIG. 1 by a dashed line and which, in addition to the switch 29, contains a limit value detector 32, to which the first phase signal from the output 18 of the first sample-and-hold circuit 12 is fed at an input 33 and which, at an output 34, delivers a selection signal, by which the switch 29 is changed over in such a way that the first input 27 is connected to the output 30 when the amount of the first phase signal exceeds a limit value specified by the limit value detector 32 and that the second input 28 is connected to the output 30 when the first phase signal falls below the limit value.

From the output 30 of the switch 29 the first or second phase signal which is present there as the case may be is fed as the resulting phase signal to a control input 35 of oscillator 1 for the purpose of controlling the frequency of the clock signal.

FIG. 2 shows some wave forms for explaining the operation of the circuit arrangement as per FIG. 1. FIG. 2a shows as an example of a frequency-divided signal a squarewave signal such as issued at output 5 of frequency divider 4, while FIG. 2b shows a ramp-shaped comparison signal derived from this by signal generator 8 and delivered at its output 9. FIGS. 2a and 2b represent in each case a period of the signals between instants t1 and t2 which coincide each time with a rising edge of the frequency-divided signal. In the middle of this period, at the time of a falling edge in the frequency-divided signal acting as reference instant to the ramp-shaped comparison signal according to FIG. 2b passes through the reference value B. However, by varying the reference value B it is also possible in another example to select another reference instant t0 in the interval between t1 and t2.

FIG. 2c shows an example of variation of a synchronizing signal, fed via the synchronizing signal terminal 14, during one of its periods. This example is of a signal obtained from a television signal which, in addition to pulses I, also contains remnants of a picture signal Y. The pulses I are to synchronize the oscillation issuing from oscillator 1 with mean values M of their leading edges F. In this case the mean values M are at half pulse height between a bottom value G and the peak A of the pulses I.

At an instant t3, in which the synchronizing signal with the synchronizing edge F passes through the mean value M, the instantaneous value of the comparison signal as per FIG. 2b is sampled in the first sample-and-hold circuit 12 by the first switching signal delivered by the edge detector 11. The value of the first phase signal thus determined is designated S1 in FIG. 2b. The value S1 is directly proportional to the phase deviation P between the passage of the comparison signal through the reference value B and the passage of the edge F of the synchronizing signal through the mean value M and therefore is directly proportional to the time difference t0−t3. The value S1 is now fed to oscillator 1 as the resulting phase signal via the control input 35 until by variation of the frequency of the clock signal the phase position of the frequency-divided signal and therefore of the comparison signal with respect to the sychronizing signal is altered to such an extent that the phase deviation P attains a magnitude of the order, for example, of half the decay time of the edge F of pulses I in the synchronizing signal. The limit value in the limit value detector 32 is selected in such a way that the change-over switch 29 is now switched and the second phase signal is subsequently fed as the resulting phase signal to oscillator 1. For example, the synchronizing signal, as illustrated in FIG. 2d, passes with its edge F through the mean value M at an instant t4 which is slightly later than instant t0. The phase deviation P is now determined by the difference t4−t0. In accordance with this phase deviation, the second sample-and-hold circuit 21 samples the value S2 at the edge F at the instant t0 of the passage of the comparison signal as per FIG. 2b and passes this on as the second phase signal via the switch 29 to oscillator 1 which is controlled by it in such a way that the phase deviation P disappears and thus the passage of edge F through the mean value M takes place at instant t0. The frequency-divided signal as per FIG. 2a and therefore the clock signal are thus synchronized with the edge F of the synchronizing signal.

In the circuit arrangement of FIG. 1 it is possible to dispense with the reference value passage detector 20 if the switching signal input 24 of the second sample-and-hold circuit 21 is directly fed with a frequency-divided signal having a variation with time as shown in FIG. 2a, in the case of which, for example, a falling edge as the switching edge coincides in time with the passage of the comparison signal through the reference value B at the reference instant t0. The line 36 between output 9 and input 22 and the line between output 23 and input 24 can then be interrupted, and instead the output 5 of frequency divider 4 is connected by the dashed line 37 with the switching signal input 24 of the second sample-and-hold circuit 21.

The clock signal synchronized with the edge F of the synchronizing signal is fed, in the circuit arrangement of FIG. 1, from output 2 of oscillator 1 to an output terminal 38 from which it can be fed to other stages (not shown) for signal processing associated with it or controlled by it. FIG. 1 also contains the first and the second comparators 10, 19 and the selector circuit 31 forming a phase detector 39 indicated by a dot-dash line.

For the sake of simplicity the signals in FIG. 2 are shown as analog signals, and the circuit arrangement of FIG. 1 has been described with the aid of these signals as an analog circuit. However, the circuit arrangement is designed preferably as a digital circuit to which a digital synchronizing signal is fed via the synchronizing signal terminal 14, the said synchronizing signal consisting of a sequence of amplitude-discrete values which are generated in an analog-digital converter 41 by sampling and quantization of an analog synchronizing signal, fed via an input 42, with the clock signal supplied via output terminal 38. The wave form of the synchronizing signal shown in FIG. 2c as an analog signal and the wave form of the ramp-shaped comparison signal as shown in FIG. 2b are then approximated by a stepped form in which the length of the individual steps corresponds with a period of the clock signal and their height is determined by the number of amplitude stages of the digital synchronizing signal.

The circuit arrangement of FIG. 1 also contains a device for suppressing interference pulses in the synchronizing signal which is accomodated largely in the edge detector 11. For this purpose, the clock signal is fed to the edge detector at a clock signal input 43 and the selection signal from the output 34 of the limit value detector 32 is fed to it at a selection signal input 44. The action of the device for suppressing interference pulses is such in particular that in the edge detector 11 in the fine phase detection operating mode, i.e. when the second phase signal S2 is fed to oscillator 1 as the resulting phase signal, only those edges in the synchronizing signal are evaluated which occur during a period of the interference-free synchronization signal. For this purpose, for example, after the occurence of an edge the synchronizing signal is not evaluated again until it is in the range of a time window which is arranged in a defined tolerance range around a time in which the next regular edge must occur. Thus all the interference edges in the synchronizing signal lying outside this time window are suppressed.

In addition, a setting signal with which, for example, the size of the time window can be varied and the limit value in the limit value detector 32 can be appropriately set is fed to the edge detector 11 and the limit value detector 32 via a setting signal line 45. Also, the device for suppression of interference pulses can be completely disabled by means of the setting signal line 45. In this way the circuit arrangement of FIG. 1 can be adjusted to a large extent to the nature and the extent of interferences contained in the synchronizing signal.

Figure 3:
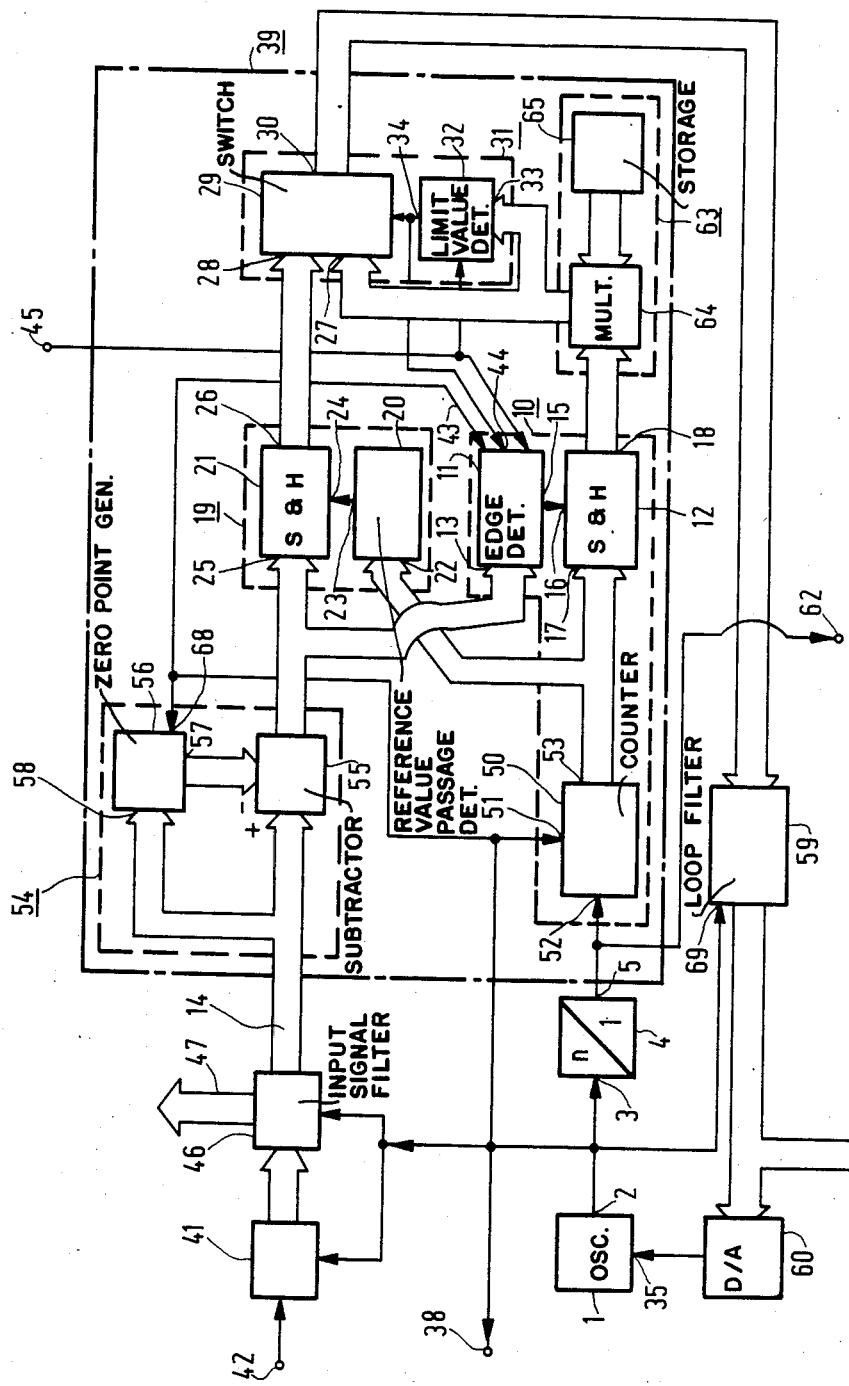

FIG. 3 shows a further embodiment of the circuit arrangement of the invention. Details of the circuit arrangement of FIG. 3 which are equivalent to those of FIG. 1 are given the same reference numbers. Digital signals which are processed in the circuit arrangement in FIG. 3 are present in parallel form as binary signals, particularly as binary numbers.

As the signal generator 8 in the circuit arrangement of FIG. 3, use is made of a counter 50 to which the clock signal is fed at a counter input 51 and the frequency-divided signal from output 5 of frequency divider 4 at a control input 52. The counter 50 counts the periods of the clock signal from an initial position into which, controlled by the frequency-divided signal at the control input 52, it is reset at the beginning of each period of the frequency-divided signal. In the case of a square-wave frequency-divided signal the resetting of the counter takes place preferably with a jump in the signal such as occurs for example at instants t1 and t2 in FIG. 2a. Eventually, resetting of the counter 50 by the frequency-divided signal can be omitted when counter 50 has its own device for resetting to the initial position after passage through a number of counter positions determined by the number by which the frequency of the clock signal is divided in the frequency divider 4.

At output 53 of counter 50 the counter position appears in the form of a digital signal which is directly used as a ramp-shaped comparison signal. The variation of the comparison signal at output 53 of counter 50 corresponds therefore to that in FIG. 2b, in which case the ramp shape is approximated by an amplitude-discrete, therefore staircase shape. Accordingly, the counter position of counter 50 is sampled by the first sample-and-hold circuit 12, controlled by the first switching signal, and is issued as the first phase signal at output 18.

In the embodiment illustrated in FIG. 3, the synchronizing signal fed via the synchronizing signal terminal 14 and consisting of a sequence of digital values is fed to the input 13 of the edge detector 11 and the synchronization signal input 25 of the second sample-and-hold circuit 21 via a zero-setting arrangement 54, which is indicated by a dash line and which contains a subtracter 55 and a zero-point generator 56. At an output 57 the zero-point generator supplies a substantially constant value which in the substracter 55 is subtracted from the synchronizing signal which is thereby set to a constant zero. For example, the zero-point generator 56 can deliver at its output 57 a value corresponding to the mean value M in FIG. 2c, as the result of which the centre between the bottom value G and the peak A of the pulses I in the synchronizing signal then always assumes the value zero.

In order also to be able to compensate for variations of the mean value M the zero-point generator 56 in the circuit arrangement as shown in FIG. 3 contains a device for determination of the zero point to be set to which the synchronizing signal is fed via an input 58 of the zero-point generator 56 and which, for example, determines the mean value M from the basic value G sampled by the synchronizing signal and the peak value A of the pulses I. To control this device the clock signal is also fed to the zero-point generator via a clock input 68. In particular, the edge detector 11 can then be designed as a zero passage detector, and an unambiguous zero is fixed for the value of the second phase signal and the resulting phase signal derived from it.

In the embodiment of the invention illustrated in FIG. 3 the digital resulting phase signal from the output 30 of the switch 29 is fed via a loop filter 59 to a digital-analog converter 60 and the analog signal obtained is fed to the control input 35 of the oscillator 1, because an analog signal has to be present here to control the frequency of the clock signal. The loop filter 59 is designed as a proportional-integral element in a manner known in the art for the purpose of converting the resulting phase signal from output 30 of the switch 29 into a form suitable for the oscillator 1. For example, high-frequency components in the resulting phase signal can be suppressed by the loop filter 59 and thus the behaviour of the circuit arrangement when controlling phase deviations can be influenced. For the control of digital filter arrangements in loop filter 59, for the continuous switching of memories it contains for example, the clock signal is also fed via a clock input 69.

Between the loop filter 59 and the digital-analog converter 60 the digital resulting phase signal is also fed to a tapping point 61 from which it can be extracted as a signal containing direct information about the frequency of the clock signal. Such a signal can be used for example in other signal-processing stages (not shown) with which the circuit arrangement in FIG. 3 can be combined, for example, in a television signal processing system. In particular, this may be significant in a system for the demodulation of digital television signals with a clock signal synchronous with the frequency of the lines in the television signal for the purpose of compensating for fluctuations of this clock signal. If, in fact, a line-synchronizing signal contained in the television signal is used as the synchronizing signal, the clock signal can be delivered via the output terminal 38 while the digital phase signal issued via tapping point 61 supplies information on variations in the frequency and/or phase of the clock signal.

For such an application of the circuit arrangement of the invention it is expedient, moreover, that the frequency of the clock signal can be varied over a wide range because, particularly when used in conjunction with video recorders the line-synchronizing signal used as the synchronizing signal may vary in its frequency over a wide range.

Furthermore, when using the circuit arrangement of FIG. 1 in a television signal processing system it is appropriate for the composite television signal, which in addition to the synchronizing signal also contains picture signals, to be converted by the analog-digital converter 41 into a digital signal. From this the digital synchronizing signal can then be filtered out in an output signal filter 46 and fed to the synchronizing signal terminal 14, while the remaining signal components are passed on via a television signal output 42 from the input signal filter 46 for further processing.

The circuit arrangement as per FIG. 3 also has a frequency divider output terminal 62 by means of which signals, phase-rigidly coupled with the clock signal, which can be used for example as horizontal synchronizing pulses when the described circuit arrangement is employed in a television signal processing system, can be released from the frequency-divided signal.

The slope of the comparison signal of FIG. 2b usually has a different, essentially lower value than the slope of the edge F in the synchronizing signal, as shown for example in FIG. 2c. In order to avoid unsteadiness in the control behaviour of the circuit arrangement of FIG. 3 when the switch 29 is changed over, the slopes of the first and second phase signals, i.e. the slopes of the ramp comparison signal on the one hand and the edge F in the synchronizing signal on the other are matched to one another over the phase. For this purpose the circuit arrangement of FIG. 3 is eqipped with a steepness-matching circuit 63 by means of which the first phase signal from output 18 of the first sample-and-hold circuit 12 is multiplied in a multiplier 64 by a steepness-matching factor before it is fed to the first input 27 of the switch 29. The steepness-matching factor is fed to the multiplier 64 from a store arrangement 65. The steepness-matching factor can be stored in the store arrangement 65 as a fixed value or as a variable value.

Figure 4:
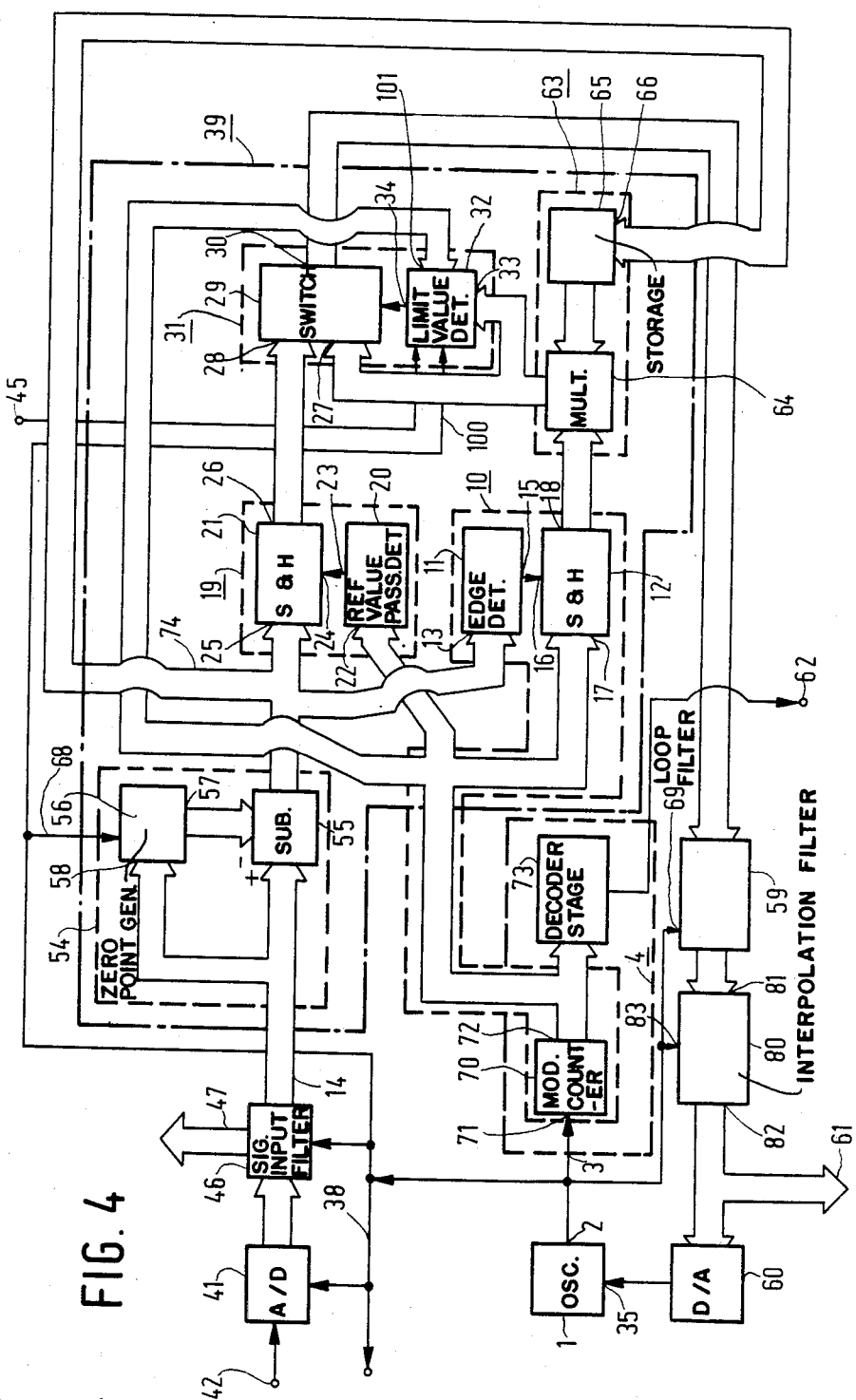

FIG. 4 shows a modification of the circuit arrangement shown in FIG. 3; the parts of the circuit arrangement which are the same are given identical designations.

The first modification compared with FIG. 3 is as follows: in the circuit arrangement shown in FIG. 4 the frequency divider 4 and the counter 50 have been replaced by a modified counter 70 and a decoder stage 73. In contrast to counter 50, the modified counter 70 has only one counter 71 to which is fed the oscillation from output 2 of oscillator 1. The counter 70 is provided with a reset device by means of which it is reset into an initial position after a defined number of counting steps. This number of counting steps represents the whole number by which the frequency of the clock signal in frequency divider 4 is divided. At the output 72 of the counter 70 a sequence of counter positions is then issued as digital signals which form a digital, ramp-shaped comparison signal as in FIG. 2b which is fed directly to the input 22 of the reference value passage detector 20 and the comparison signal input 17 of the first sample-and-hold circuit 12. The comparison signal is also fed to the decoder stage 73 which decodes defined counter positions and delivers a frequency-divided signal at the frequency divider output terminal 62. Because in the circuit arrangement of FIG. 4 the frequency-divided signal is no longer needed in phase detector 39, it can be adapted immediately by the decoder stage 73 for further processing, as horizontal synchronizing pulses for example. In FIG. 4 the dash-lined border round 4 and 10 indicate that the counter 70 is common to the frequency divider 4 and the first comparator arrangement 10.

In the circuit arrangement of FIG. 4 the store arrangement 65 of the steepness-matching circuit 63 is also provided with an input 66 to which the synchronizing signal is fed by a line connection 74 from the output of the subtracter 55 of the zero-point setter 54. The store arrangement 65 is then equipped with a detector arrangement by means of which the amplitude of the synchronizing signal is detected and the steepness-matching factor is determined from this. Eventually, the comparison signal can be fed, via a further input, to the detector in the store arrangement 65 as a reference to this. Even more advantageously, however, the store arrangement 65 can be fed a signal representing the amplitude of the synchroniing signal from the zero-point generator 56 at the input 66 when the zero-point generator for fixing the zero point of the synchronizing signal detects its amplitude.

In addition, an interpolation filter 80 is inserted in the signal path of the resulting phase signal between the loop filter 59 and the digital-analog converter 60 or the tapping point 61. The resulting phase signal from the loop filter 59 is fed to this interpolation filter at a phase signal input 81, and the phase signal converted in the interpolation filter 80 is fed from a phase signal output 82 to the digital-analog converter 60. The clock signal from oscillator 1 is fed to the interpolation filter at a clock input 83.

The interpolation filter 80 converts jumps in the resulting phase signal, such as can occur, for example, due to jump-like phase shifts of the pulses in the synchronising signal, into ramp-shaped transitions. This can be achieved, for example, in the following way: in the event of a sudden variation of the resulting phase signal at phase signal input 81 the value of the converted phase signal at phase signal output 82 is varied according to a ramp function until the value at the phase signal output is matched with the value at the phase signal input. The height of the jump in the resulting phase signal is then directly converted into the length of the ramp produced. This then also limits the rate of a frequency change of the clock signal caused by the resulting phase signal.

On the one hand, the digital phase signal delivered via tapping point 61 is thus free from uncontrolled jumps. On the other hand, the transient behaviour of oscillator 1 in the case of variations in the resulting phase signal can be improved particularly when the duration of the rise of the ramp in the phase signal is large compared with a time constant determining the pull-in properties of oscillator 1. The levelling out of phase jumps in the synchronising signal by the circuit arrangement is usually slightly delayed when using an interpolation filter 80. Since, moreover, the interpolation filter supplies other interpolated values in addition to the synchronizing signal frequency values of the resulting phase signal, the digital-analog converter 60 has a correspondingly increased conversion rate.

Figure 5:
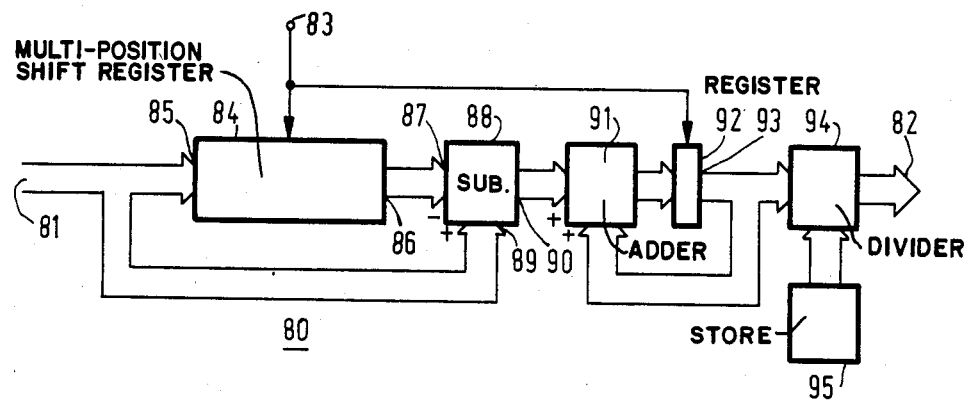

In another example the interpolation filter 80 is designed in such a way that it matches the slope in the ramp of the converted phase signal at phase signal output 82 to the height of a jump in the resulting phase signal at phase signal input 81. An example of such a circuit arrangement is shown in FIG. 5. It contains a multi-position shift register 84 to which the values of the phase signal are fed at an input 85 from the phase signal input 81 and which stores them at a clock pulse rate determined by the clock signal supplied at clock input 83. In this case, each of the values of the resulting phase signal supplied at the repetition frequency of the pulses in the synchronizing signal is stored in the shift register several times according to a number of interpolation positions, determined by the clock pulse, between two values of the resulting phase signal. The length of the shift register and the clock are matched to one another in such a way that the values of the resulting phase signal supplied at input 85 appear each time at an output 86 of the shift register 84 after one period of the synchronizing signal and are passed from there to a negative input 87 of a subtracter 88. The resulting phase signal from phase signal input 81 is passed without delay to a positive input 89 of subtracter 88. At an output 90 the subtracter 88 delivers the difference between the instantaneous of the resulting phase signal and the value delayed by one period of the synchronizing signal. This difference is accumulated in an accumulator formed in the known manner from an adder 91 and a register 92. At the output 93 of the accumulator the sum of the values of the resulting phase signal stored in the shift register at the respective instant is released and passed on to a divider 94 in which it is divided by the number of the values stored in the shift register 84, so that the mean value of the values stored in shift register 84 and therefore a weighted mean of two successive values of the resulting phase signal are issued at the output of the divider 94, which is connected to the phase signal output 82 of the interpolation filter 80. The sequence of weighted means then forms the ramp transition between two successive values of the resulting phase signal. A divisor corresponding to the number of positions of the shift register 84 is fed from a store 95 to the divider 94. Eventually, the number of positions of the shift register 84 and the divisor in store 95 may be variable, i.e. switchable.

In the circuit arrangement of FIG. 4 a device for the suppression of interference pulses is also included in the limit value detector 32. The clock signal is fed to this device by way of a clock input 100 and the counter positions of counter 70 are fed to it via a comparison signal input 101. These counter positions fix a time window in the limit value detector 32 outside of which a first phase signal supplied via input 33 remains disregarded. As also described with reference to FIG. 1, the time window can be switched on or off for the operating modes of coarse or fine phase detection, depending on the position of switch 29, i.e. depending on the selection signal at output 34 of the limit value detector 32, or the width of the time window can be switchable. The on, off or change-over operations can also be performed by signals supplied from outside by way of a setting signal line 45.

Figure 6:
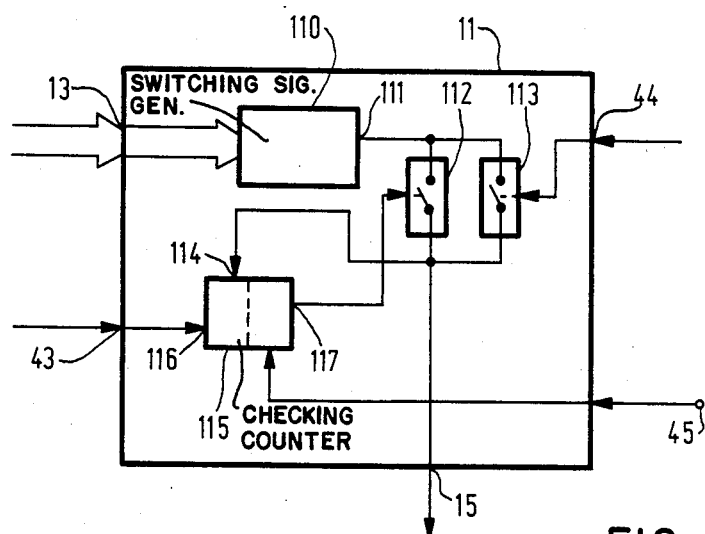
FIG. 6 shows an embodiment of an edge detector used in the circuit arrangements of FIG. 1 or 3.

As an example of a device for the suppression of interference pules FIG. 6 shows an appropriate embodiment of the edge detector 11 such as is used for example in the circuit arrangements of FIG. 1 or 3. The synchronizing signal fed to the edge detector 11 via the input 13 is fed to a switching signal generator 110 which, for example, on the occurrence of an edge F delivers as the first switching signal at its output 111 a pulse which is fed via a parallel arrangement of two gates 112, 113 to the output 15 of the edge detector 11 and to a starting input 114 of a checking counter 115. The clock signal from clock signal input 43 is also fed to the checking counter 115 at a counter input 116. The checking counter 115 is started by the pulse at starting input 114 and counts the periods of the clock signal. A decoder contained in checking counter 115 decodes determined counter positions and issues at an output 117 a blanking signal whereby the first gate 112 is opened only in a time interval which contains an instant which is one period of the synchronizing signal removed from the last edge F in the said signal. Outside this time interval, the first gate 112 is closed. This means that any edges in the synchronizing signal caused by interference which occur outside the time interval are suppressed, i.e. no pulses are passed through to output 15.

Only the correct-phase pulse from output 111 of switching signal generator 110, produced by the next edge F in the synchronizing signal, is passed on to output 15 of edge detector 11 and this, moreover, re-starts the checking counter 115 via starting input 114 in such a way that this counter begins once again to count the periods of the clock signal.

The checking counter 115 can be designed in such a way that it is retained in a given counter position when there is no correct-phase edge F at the end of the time interval and in this position holds the first gate 112 either in the blocked or conducting state. However, at the end of the time interval it may also start to count again automatically. Thus, for example, the situation may be reached where in the absence of a correct-phase edge F in the said time interval the previous value of the first phase signal is retained at output 18 of the first sample-and-hold circuit 12 and this, for example, prevents the entire circuit arrangement from dropping out of the synchronized state when only one edge is missing from the synchronizing signal.

If after reaching a certain counter position the checking counter 115 automatically stops and the first gate 112 remains conducting in this situation, the edge detector 11 is in a waiting position in which it waits for the next edge F in the synchronizing signal if the circuit arrangement has dropped out of the synchronized state.

The second gate 113 is controlled directly by the selection signal at output 34 of the limit value detector by way of the selection signal input 44. Thus, in the operating state of coarse phase detection the above-described device can be bypassed, i.e,. disabled, for the purpose of suppressing interference pulses, until the entire circuit arrangement is in the synchronized condition again.

In one embodiment of the circuit arrangement of the invention, a pulsed line synchronizing signal with the frequency of 15.625 kHz (PAL standard) is supplied as the synchronizing signal. The clock signal delivered by oscillator 1 has a frequency of 13.5 MHz. The frequency divider 4 divides the frequency of this oscillation by the factor 864 so that the frequency-divided signal has the frequency of the line synchronizing signal. In the case of the SECAM standard, the frequency of the clock signal is also fixed preferably at 13.5 MHz and is divided in the frequency divider by the whole number 864. In the case of other standards, for example PAL N, PAL M, NTSC and others, on the other hand, the frequency divider 4 divides the frequency of the clock signal preferably by 858.

What is claimed is:

1. In a circuit for synchronizing the phase of a frequency divided signal with a sync edge of an essentially periodic synchronizing signal, the edge having a finite slope, the circuit including:
 a frequency adjustable oscillator for generating a clock signal;
 a frequency divider for generating the frequency divided signal by dividing the frequency of the clock signal by an integer; and
 a phase detector, wherein the phase detector comprises:
 (a) a first comparator means for determining a phase difference between a reference instant in the frequency divided signal and the sync edge of the synchronizing signal and for supplying a first phase signal corresponding to the phase difference;
 (b) a second comparator means for sampling the synchronizing signal at the reference instant and for supplying a second phase signal corresponding to a value representative of the synchronizing signal at the reference instant;
 (c) a selector means for deriving a resulting phase signal from the first phase signal when the first phase signal exceeds a limit value and from the second phase signal when the first phase signal falls below the limit value, the resulting phase signal being applied to the oscillator for controlling the frequency of the clock signal;
 whereby the synchronizing signal is applied to the phase detector as a sequence of amplitude discrete values formed by sampling the synchronizing signal with the clock signal, a sufficient number of amplitude stages being provided for the sync edge in the synchronizing signal.

2. Circuit as claimed in claim 1, wherein the resulting phase signal, after the first phase signal exceeds the limit value, is derived from the first phase signal only when the first phase signal exceeds the limit value within a determined time interval.

3. Circuit as claimed in either claim 1 or 2, wherein the first comparator means comprises;
a signal generator receiving said clock and frequency divided signals for supplying an essentially ramp-shaped comparison signal; and
an edge detector and a first sample and hold circuit for sampling and storing an instantaneous value of the comparison signal at a particular time and for delivering the comparison signal value as the first phase signal when the edge detector detects the sync edge of the synchronizing signal.

4. Circuit as claimed in claim 3, wherein the reference instant is determined at a point whereby the comparison signal passes through a reference value; and
wherein the second comparator means comprises:
a reference value detector and a second sample and hold circuit for sampling and storing an instantaneous value of the synchronizing signal at a second particular time and for delivering the synchronizing signal value as a second phase signal when the reference value detector detects the comparison signal passing through the reference value.

5. Circuit as claimed in claim 4, further comprising:
a zero-setting means connected to the second comparator means, the zero-setting means having a synchronizing signal input for receiving the synchronizing signal, the synchronizing signal being applied to the second comparator means through the zero setting means.

6. Circuit as claimed in claim 3, further comprising:
a steepness matching circuit interposed between the selector circuit and the first comparator means, the steepness matching circuit adapting the slopes of the ramp-shaped comparison signal to the sync edge of the synchronizing signal, the first phase signal being applied through the steepness matching circuit to the selector circuit.

7. Circuit as claimed in claim 3, wherein the frequency divider and the signal generator are formed by a common counter continuously switched by the clock signal.

8. Circuit as claimed in claim 1, wherein the synchronizing signal comprises:
a sequence of amplitude discrete values, the amplitude discrete values being approximated by steps each length of which corresponding to a period of the clock signal; and wherein the frequency divider derives horizontal sync pulses from the frequency divided signal for obtaining a sequence of amplitude discrete signal values from an analog signal.

9. Circuit as claimed in claim 1, wherein the resulting phase signal is applied to the oscillator via a digital analog convertor.

10. Circuit as claimed in claim 1, wherein the resulting phase signal is applied to the oscillator via an interpolation filter.

* * * * *